(12) United States Patent
Kim

(10) Patent No.: US 7,425,389 B2
(45) Date of Patent: Sep. 16, 2008

(54) LINE PHOTO MASKS AND METHODS OF FORMING SEMICONDUCTOR DEVICES USING THE SAME

(75) Inventor: Si-Youn Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 636 days.

(21) Appl. No.: 11/024,343

(22) Filed: Dec. 27, 2004

(65) Prior Publication Data

US 2005/0142459 A1  Jun. 30, 2005

(30) Foreign Application Priority Data

Dec. 30, 2003  (KR) ............ 10-2003-0100881

(51) Int. Cl.
*G03F 1/00* (2006.01)
*G03C 5/00* (2006.01)

(52) U.S. Cl. .......................... 430/5; 430/322
(58) Field of Classification Search .............. 430/5, 430/322–324
See application file for complete search history.

(56) References Cited

U.S. PATENT DOCUMENTS

| 5,807,649 | A | 9/1998 | Liebmann et al. |
| 6,339,239 | B1 | 1/2002 | Alsmeier et al. |
| 2005/0255387 | A1* | 11/2005 | Butt et al. ............ 430/5 |

FOREIGN PATENT DOCUMENTS

| JP | 2000-208609 | 7/2000 |
| KR | 2003-36111 | 5/2003 |

OTHER PUBLICATIONS

English language abstract of Japanese Publication No. 2003-36111, May 9, 2003.

English language abstract of Japanese Publication No. 2000-208609, Jul. 28, 2000.

* cited by examiner

*Primary Examiner*—Stephen Rosasco
(74) *Attorney, Agent, or Firm*—Marger Johnson & McCollom, P.C.

(57) ABSTRACT

According to various embodiments of the invention, there are provided line photo masks having a plurality of line patterns. These masks, which are suitable for preventing electric shorts between the data line images, are disposed on the semiconductor substrate by transferring them, which have the plurality of line patterns, onto a photoresist layer. One of the line patterns has at least one trench pattern.

21 Claims, 9 Drawing Sheets

LINE PHOTO MASKS AND METHODS OF FORMING SEMICONDUCTOR DEVICES USING THE SAME

CROSS-REFERENCE TO RELATED APPLICATION

This patent application claims priority from Korean Patent Application No. 10-2003-0100881, filed Dec. 30, 2003, the contents of which are hereby incorporated by reference in their entirety.

BACKGROUND OF THE INVENTION

1. Technical Field

The invention relates to photo masks and methods of fabricating semiconductor devices using such photomasks, and more particularly, to line photo masks and methods of fabricating semiconductor devices using the same.

2. Discussion of the Related Art

Generally, a semiconductor device includes individual elements and data line patterns electrically connecting these elements. The individual elements include a transistor, a capacitor and resistors, or the like. The data line patterns are disposed between the individual elements and function to transmit selected data of a user to the individual elements, and to display specific data to the user. Further, the data line patterns which are formed on a semiconductor substrate are greater in size than the individual elements but within the dimensional range which is allowed in the semiconductor fabrication processes. The configuration permits a device to minimize the resistance between lines during the transmission of data.

However, the narrower the tolerance range in the semiconductor fabrication process due to the reduction of design rules, the harder it is to form the requisite data line patterns on the semiconductor substrate. In the case of a semiconductor substrate having more than two data line patterns thereon, the effect of the semiconductor fabrication processes on the data line patterns should be carefully considered. For example, a photo process within the fabrication processes generates more light interference to images transmitted onto a photoresist layer in an exposure operation when more than two data line patterns are to be formed on a semiconductor substrate as compared to employing one data line pattern. The light interference can have an adverse effect on the integration of the data line patterns on the semiconductor substrate and on the uniformity of the distances between them. Thus, it is necessary to employ a method which overcomes the light interference effect and is within a given design rule. Thus, the data line patterns must be formed on the semiconductor substrate without electric shorts or cutting of the data lines.

U.S. Pat. No. 5,807,649 to Lars W. Liebmann, et al (the '649 patent) discloses lithographic patterning method and a mask set therefor which employs a light field trim mask. According to the '649 patent, the method uses the mask set including forming a device layer in a photosensitive layer using a phase shift mask and a trim mask. The phase shift mask has a first opaque region which forms a device layer and a first transparent region defining the region. The trim mask has a second opaque region for masking the first opaque region of the phase shift mask from light, and a second transparent region for defining the region. Thus, the phase shift mask and the trim mask can provide a specific device layer.

However, the method of the '649 patent needs to perform two distinct photo processes related to two photo masks, thereby causing the increase in production time and costs.

Further, since one of the two photo masks is a phase shift mask, a process of forming the phase shift mask is more complicated than a process of forming a binary mask. Again, this results in increasing the production time and costs of producing the photo mask.

SUMMARY OF THE INVENTION

According to certain embodiments of the invention, there are provided line photo masks having a plurality of line patterns, suitable for preventing electric shorts between the data line images, which are disposed on the semiconductor substrate by transferring the line photo mask having the plurality of line patterns on a photoresist layer. One of the line patterns has at least one trench pattern.

And there are also provided methods of forming line photo masks having two line patterns capable of preventing electric shorts between the data line images, which are formed on the semiconductor substrate by transferring the line photo mask onto a photoresist layer to align one of the plurality of line patterns, having at least one trench pattern, with line contact holes.

BRIEF DESCRIPTION OF THE DRAWINGS

Exemplary embodiments of the invention will be readily apparent to those of ordinary skill in the art upon review of the detailed description that follows when taken in conjunction with the accompanying drawings, in which like reference numerals denote like parts.

DETAILED DESCRIPTION OF THE PREFERRED EMBODIMENTS

Figure 1:
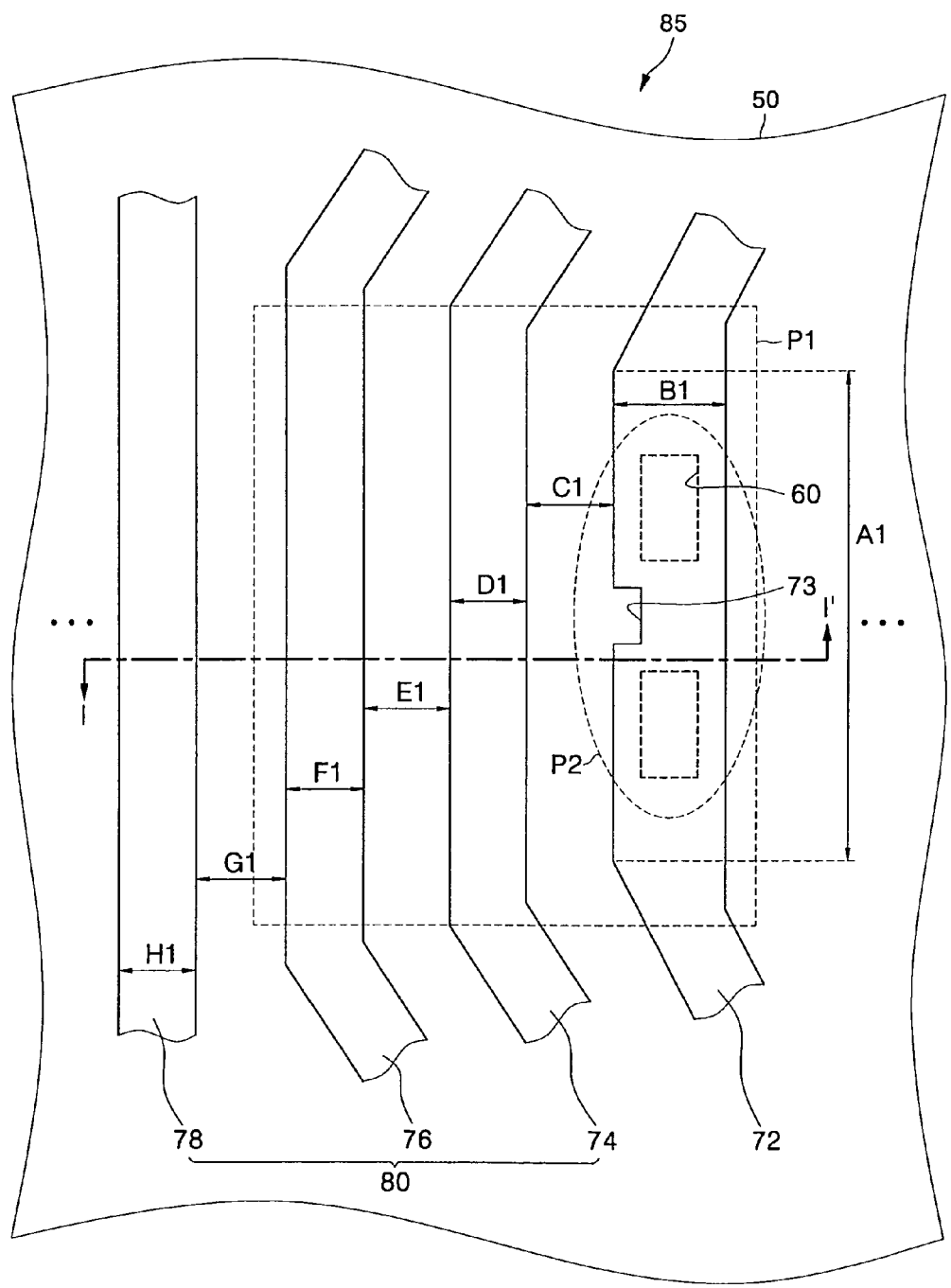
FIGS. 1 and 2 are schematic views illustrating line photo masks according to embodiments of the invention.

Referring to FIGS. 1 through 4, a line photo mask 85 includes a mask substrate 50 and first to fourth line patterns 72, 74, 76, 78 thereon. The first and second line patterns 72, 74 are typically disposed substantially in parallel on a first portion of the line photo mask 85, and have different widths B1 and D1, respectively. The width B1 of the first line pattern 72 is greater than the width D1 of the second line pattern 74. A distance C1 between the line patterns 72, 74 has a predetermined size. Further, the third and fourth line patterns 76, 78 are disposed opposite to the first line pattern 72 and in parallel with the second line pattern 74. Widths F1, H1 of the third and fourth line patterns 76, 78 are substantially the same as the width D1 of the second line pattern 74. Distances E1, G1 between the second and third line patterns 74, 76 and the third and fourth line pattern 76, 78 are substantially the same as the distance C1 between the first and second line patterns 72, 74. Further, the widths D1, F1, H1 of the second, third, and fourth line patterns 74, 76, 78 have substantially the same dimension as the distances E1, G1 between the second and third line patterns 74, 76 and the third and fourth line pattern 76, 78.

The line photo mask 85 is disposed on the semiconductor substrate and aligned with a contact hole photo mask (not shown) during a photo process. If the line photo mask 85 is disposed to overlap the contact hole photo mask, for verification of the design, any one of the first to fourth line patterns 72, 74, 76, 78 is preferably disposed to overlap at least two line holes 60 on the contact hole photo mask. Further, the first line pattern 72 has a trench pattern 73 between the line holes 60. The trench pattern 73 is disposed to extend from one side of the first line pattern 72 toward the interior thereof. The second, third and fourth line patterns 74, 76, 78 are disposed in parallel with a portion of the first line pattern 72, having a predetermined longitudinal length A1. The width B1 of the first line pattern 72 is smaller in size than ½ the predetermined length A1.

Figure 3:
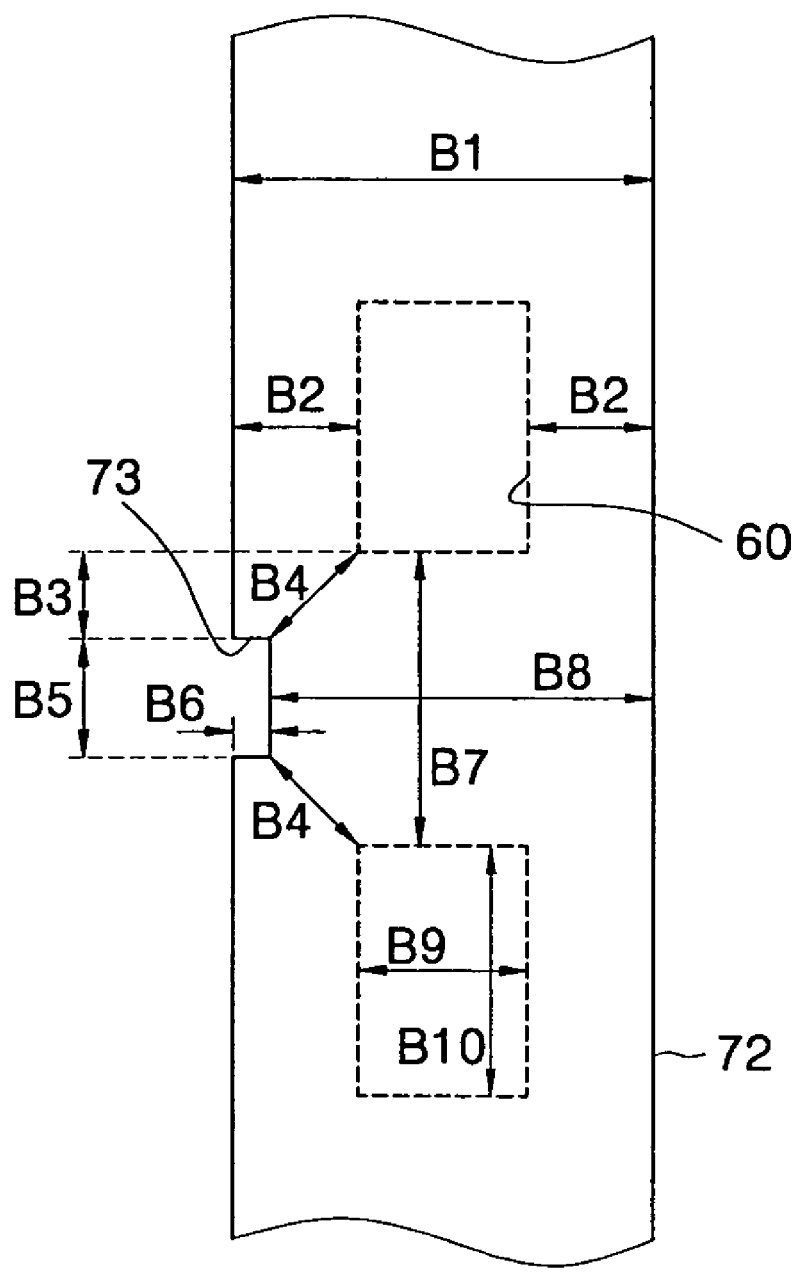
FIGS. 3 and 4 are enlarged schematic views illustrating portions of FIGS. 1 and 2, respectively.

The locations of the line holes 60 and the trench pattern 73 can be explained as follows with reference to FIG. 3, which is an enlarged view of a predetermined portion P2 of FIG. 1. That is, a distance B2 between the one side of the first line pattern 72 and one side of the line hole 60 adjacent to the one side of the first line pattern 72 is substantially the same size as a distance B4 between one selected corner of the trench pattern 73 and one corner of the line hole 60 facing the selected corner of the trench pattern 73 with the shortest length. Further, the line holes 60 are spaced apart from each other by a predetermined distance B7, and overlapped with the first line pattern 72 by a predetermined width B2. Each of the line holes 60 has horizontal and longitudinal widths B9, B10, respectively.

In the trench pattern 73, its bottom surface and side surfaces are disposed perpendicular to each other. The trench pattern 73 has a width B5 of the opening between its side surfaces. The width B5 of the trench pattern 73 is smaller in size than the distance B7 between the line holes 60. A depth B6 of the trench pattern 73 is smaller in size than a distance B2 between a side of the first line pattern 72 and the side of the line hole 60 adjacent a side thereof, in a direction of the width of the first line pattern 72.

The distance B2 between the one sidewall of the first line pattern 72 and the one side of the line hole 60 adjacent the one side thereof in the direction of the width of the first line pattern 72 is greater than distance B3 between an extension line of the line hole 60 disposed with the shortest length from a selected corner of the trench pattern 73 and a lateral surface of the trench pattern 73 in a direction perpendicular to the width of the first line pattern 72. The distance B8 between the bottom surface of the trench pattern 73 and the side of the first line pattern 72 facing the bottom surface is formed smaller than a width B1 of the first line pattern 72. The width B5 of the upper side of the trench pattern 73 is smaller in size than a distance B7 between the line holes 60. The line photo mask 85 is preferably a binary mask.

Secondly, the first to fourth line patterns 72, 74, 76, 78 of FIG. 1 may have modified shapes according to another embodiment of the invention. That is, a line photo mask 115 of FIG. 2 includes a mask substrate 90 and first to fourth line patterns 102, 104, 106, 108 thereon. The first and second line patterns 102, 104 are disposed in parallel on a portion of the line photo mask 115. Patterns 102, 104 have different widths B11, D2, respectively. The width B11 of the first line pattern 102 is greater than the width D2 of the second line pattern 104. A distance C2 between the first and second line patterns 102, 104 has a predetermined size. Further, the third and fourth line patterns 106, 108 are disposed opposite to the first line pattern 102 and in parallel with the second line pattern 104. Widths F2, H2 of the third and fourth line patterns 106, 108, respectively, are substantially the same as the width D2 of the second line pattern 104. Distances E2, G2 between the second and third line patterns 104, 106, and the third and fourth line patterns 106, 108 are substantially the same as the distance C2 between the first and second line patterns 102, 104. Further, the widths D2, F2, H2 of the second, third, and fourth line patterns 104, 106, 108 have substantially the same size as the distances E2, G2 between the second and third line patterns 104, 106, and the third and fourth line patterns 106, 108.

The line photo mask 115 is disposed on the semiconductor substrate and aligned with a contact hole photo mask during a photo process in a similar manner to mask 85 of FIG. 1. If the line photo mask 115 is disposed to overlap the contact hole photo mask for verification of design, one of the first to fourth line patterns 102, 104, 106, 108 is preferably disposed to overlap at least two line holes 100 on the contact hole photo mask. Further, the second line pattern 102 has a trench pattern 103 between the line holes 100, and the trench pattern 103 is disposed to extend from one side of the first line pattern 102 toward the interior thereof. The second, third and fourth line patterns 104, 106, 108 are disposed parallel to a portion of the first line pattern 102 having a predetermined length A2 perpendicular to the widths thereof. The width B11 of the first line pattern 102 is smaller than ½ the predetermined length A2.

Figure 4:
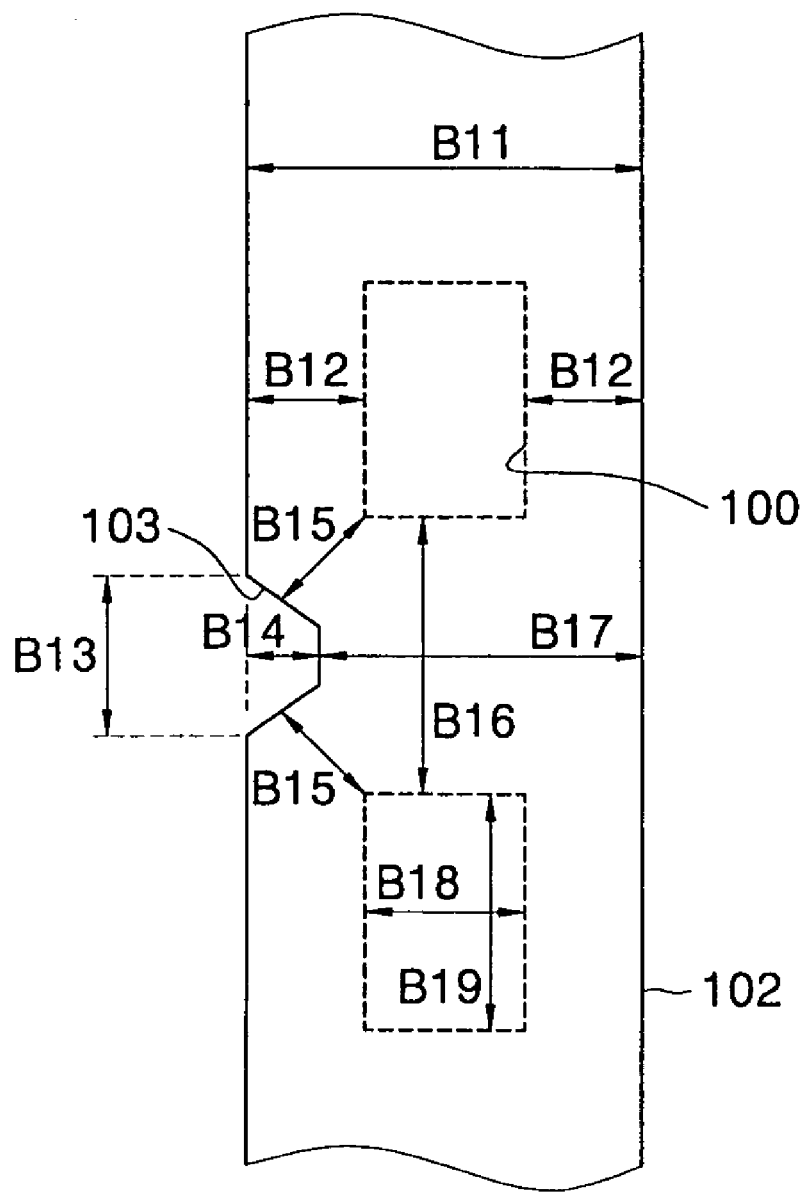

The locations of the line holes 100 and the trench pattern 103 can be explained as follows in reference to FIG. 4, which is an enlarged view of a predetermined portion P4 of FIG. 2. That is, a distance B12 between the one side of the first line pattern 102 and one side of the line hole 100 adjacent to the sidewall of the first line pattern 102, is the same size as a distance B15 between one selected side surface of the trench pattern 103 and one corner of the line hole 100 facing the selected lateral surface of the trench pattern 103 with the shortest length. Further, the line holes 100 are spaced apart from each other by a predetermined distance B16, and overlapped with the first line pattern 102 by a predetermined width B12. Each of the line holes 100 has horizontal and longitudinal widths B18, B19, respectively.

Next, the bottom surface of the trench pattern 103 is disposed at an obtuse angle with respect to the side surface thereof. A width B13 comprises the upper opening of the trench pattern 103. Therefore, the trench pattern 103 has a tapered shape. The width of the bottom surface of the trench pattern 103 is smaller in size than a distance B16 between the line holes 100. A depth B14 of the trench pattern 103 preferably is smaller than ½ the width B11 of the first line pattern 102. A distance B17 between the bottom surface of the trench pattern 103 and a side surface of the first line pattern 102 facing the bottom surface of the trench pattern 103 preferably is smaller in size than a width B11 of the second line pattern 102. The line photo mask 115 preferably is a binary mask.

Figure 5:
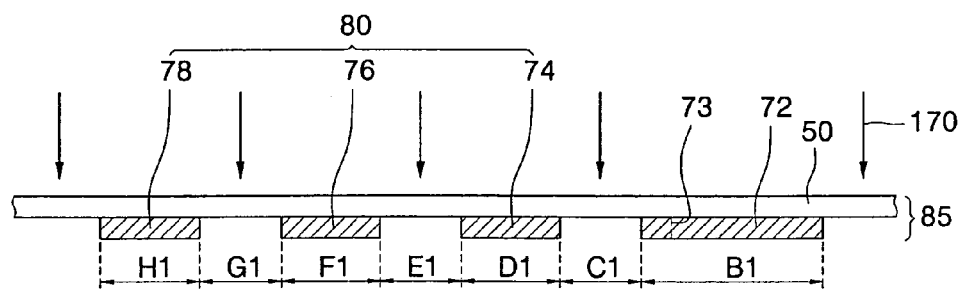
FIGS. 5 through 8 are cross-sectional views taken along line I-I' of FIG. 1 illustrating a method of fabricating semiconductor devices by using a line photo mask.
Figure 5:
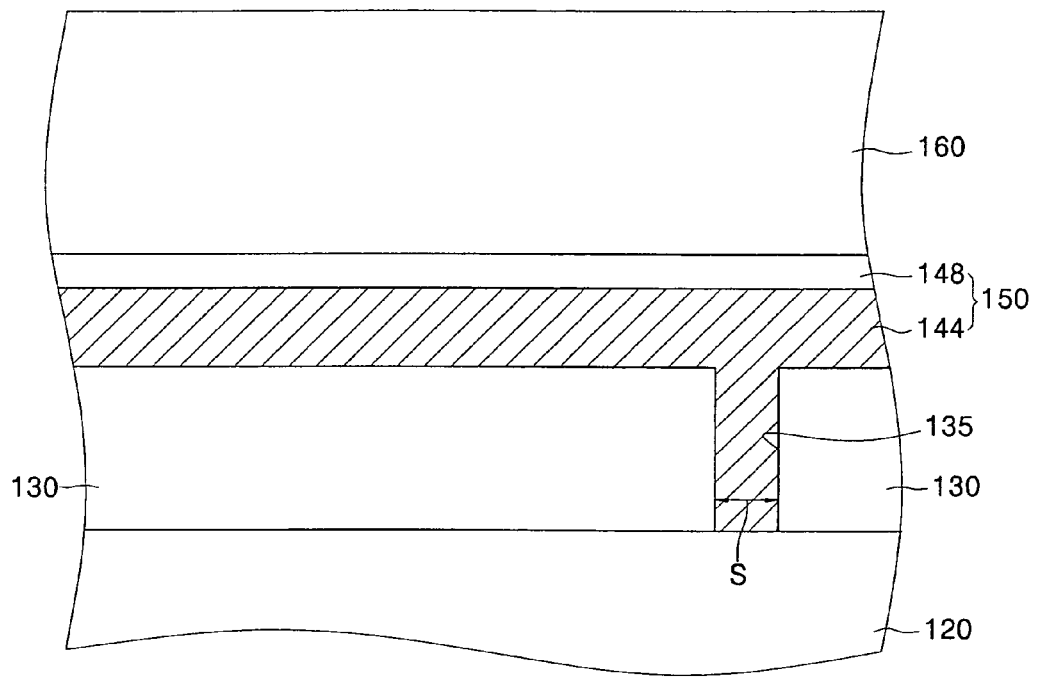
Figure 6:
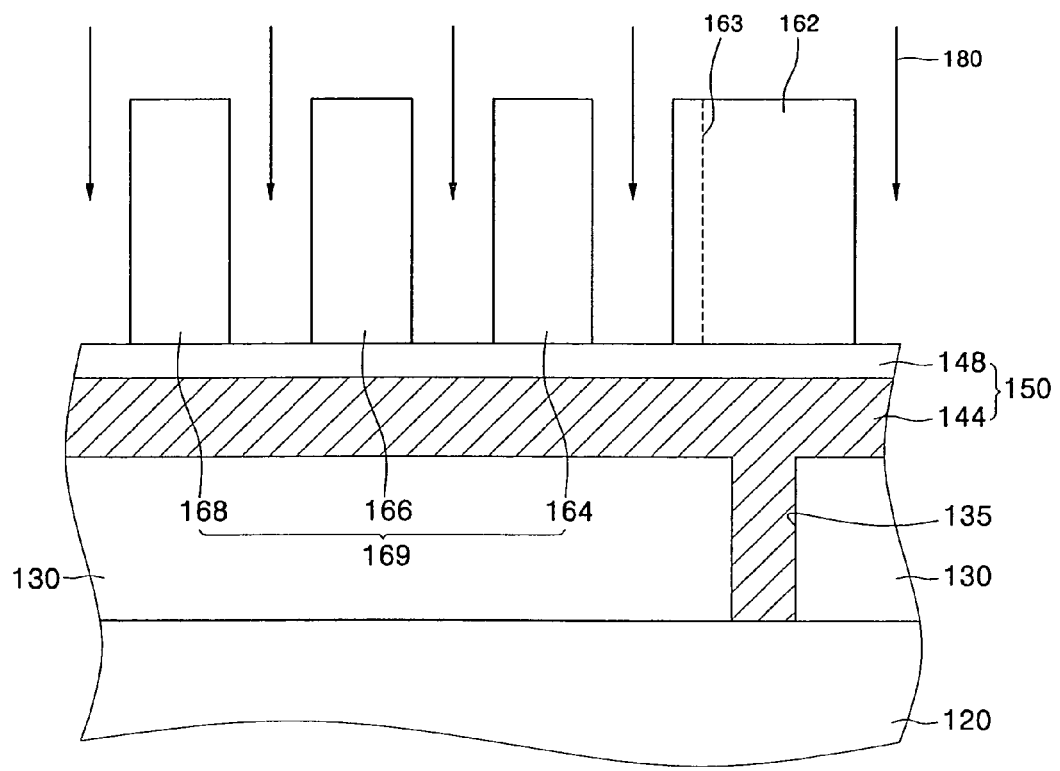
Figure 7:
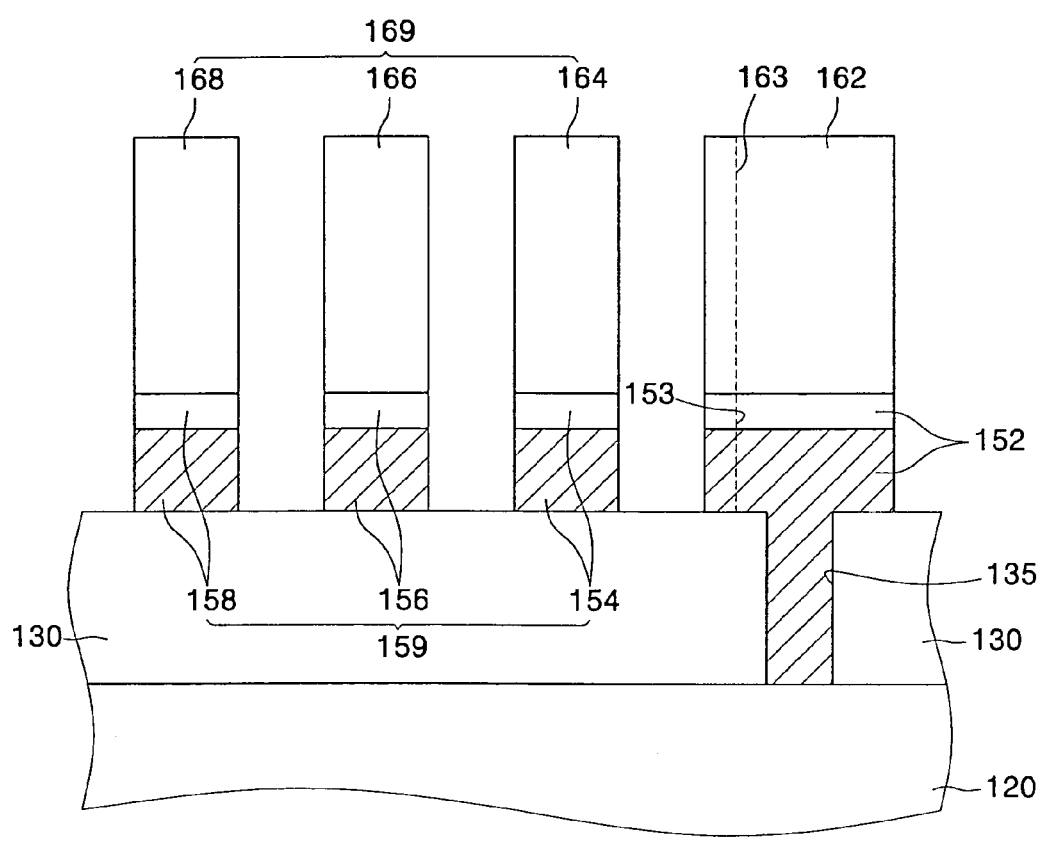
Figure 8:
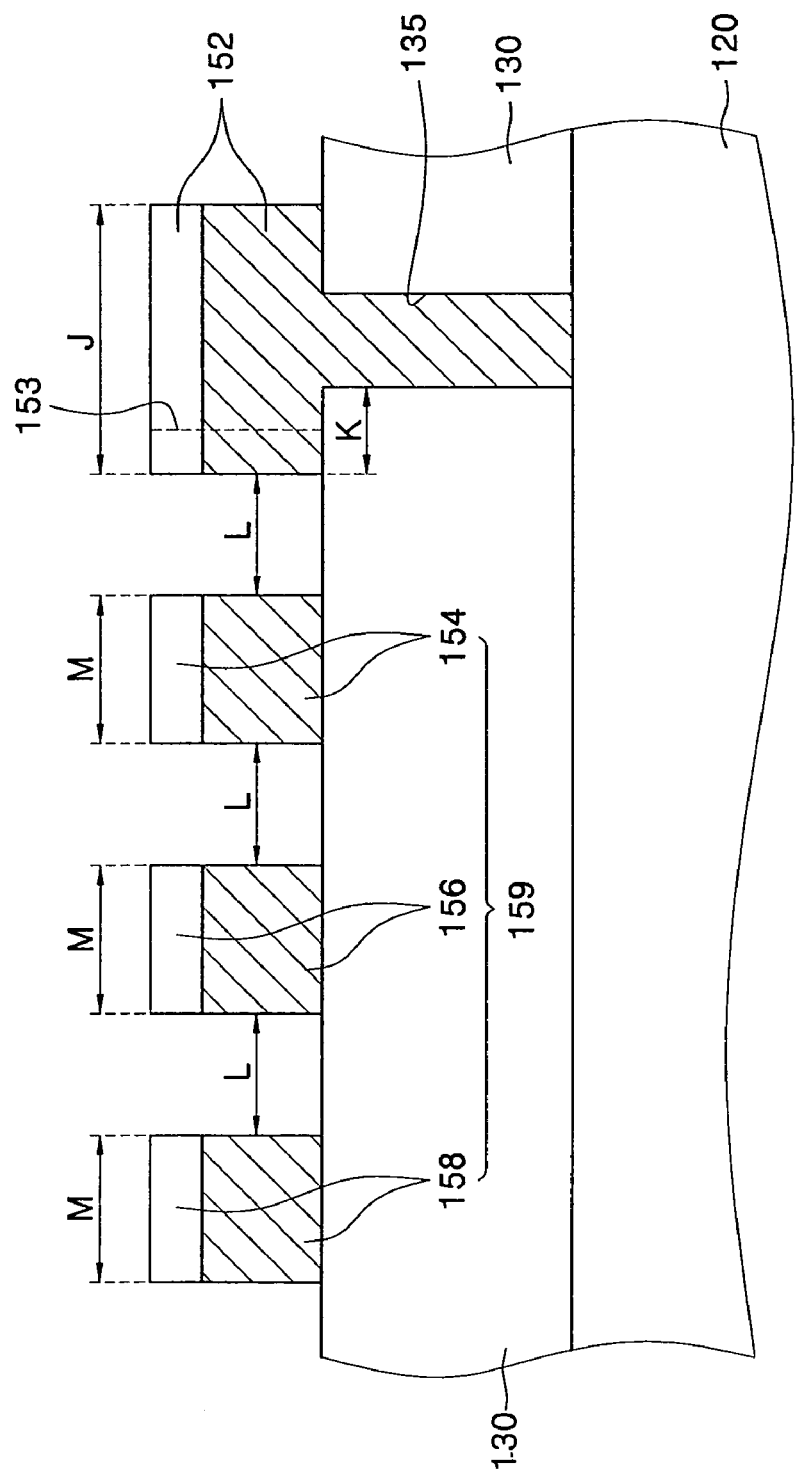

Now, methods of fabricating semiconductor devices by using line photo masks according to embodiments of the invention will be explained in reference to accompanying drawings. Referring to FIGS. 2 and 5, an interlayer insulating layer 130 is formed on a semiconductor substrate 120, and the interlayer insulating layer 130 has at least two line contact holes 135 therein. The line contact holes 135 expose an upper surface of the semiconductor substrate 120, and each of the line contact holes 135 has a predetermined dimension of diameter S. The line contact holes 135 are formed on the semiconductor substrate 120 through the semiconductor fabrication processes by using the line holes 60 on the contact hole photo mask mentioned in reference to FIG. 1.

Figure 2:
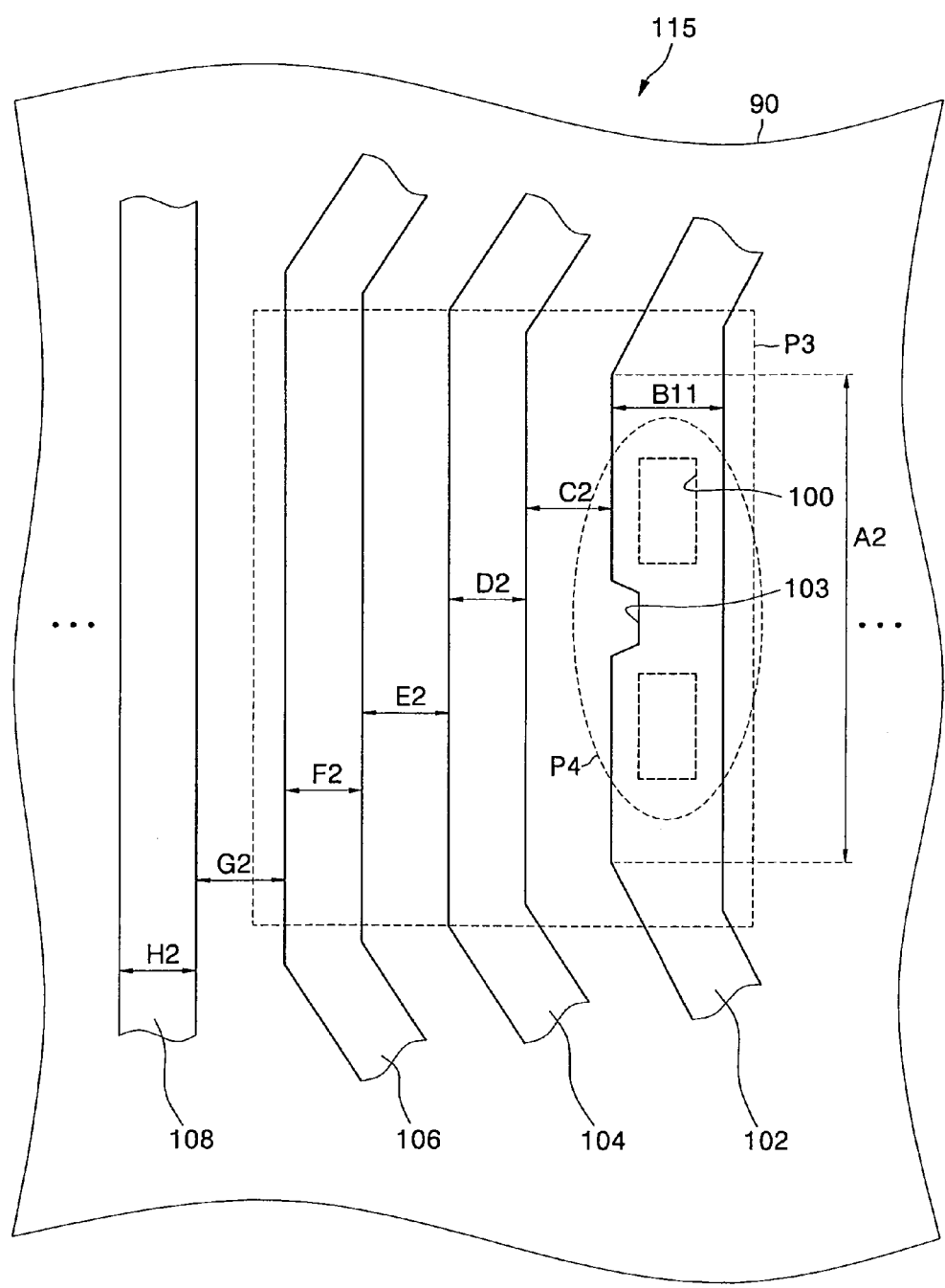

A line layer 150 and a photoresist layer 160 are sequentially formed on the semiconductor substrate having the line contact holes 135, and the line photo mask 85 of FIG. 2 is disposed on the photoresisit layer 160. Then, a photo light 170 is irradiated on the photoresist layer 160 by using the line photo mask 85 during the photolithography process.

The line photo mask 85 includes the mask substrate 50, and the first line pattern 72 having the trench pattern 73, and a group of line patterns 80, which consist of first, third, and fourth line patterns 74, 76, 78. The second, third and fourth line patterns 74, 76, 78 are formed such that the distances E1, G1 between the second and the third line patterns 74, 76, and the third and fourth line patterns 76, 78 are formed to be substantially identical in size, and the widths D1, F1, H1 of the second, third and fourth line patterns 74, 76, 78 are formed to be substantially identical in size as well. Further, the widths D1, F1, H1 of the second, third, and fourth line patterns 74, 76, 78 are formed to have substantially the same size as the distances E1, G1 between them. A distance C1 between the first line pattern 72 and the group of line patterns 80 have substantially the same size as the widths D1, F1, H1 of the second, third and fourth line patterns 74, 76, 78. The line photo mask 85 is preferably formed to have the same location relations as the first to fourth line patterns 72, 74, 76, 78, the trench pattern 73, and the line holes 60 as shown in FIG. 1. The line photo mask 85 is preferably formed of a binary mask.

The line layer 150 is formed of a conductive layer 144 and a line capping layer 148 stacked thereon. The line capping layer 148 is preferably formed to have an insulating layer having an etching ratio different from the interlayer insulating layer 130.

Referring to FIGS. 2, and 6 through 8, a photo process is performed in the photoresist layer 160 to form photoresist patterns 164, 162, 166, 168 on the semiconductor substrate 120. The photoresist patterns 162, 164, 166, 168 are formed on the line capping layer 148 to transfer the first to fourth line patterns 72, 74, 76, 78 onto the line photo mask 85 in the photoresist layer 160 during an exposure step of the photo process. Then, the photoresist layer 160 is developed during a development step. The photoresist patterns 162, 164, 166, 168 will be referred to as "first to fourth data line images", respectively. One of the first to fourth data line images, which has a trench pattern image 163, is formed above the line contact holes 135. The trench pattern image 163 is formed to extend from one side of the first data line image 162 toward the interior of the image, and faces one group of data lines images 169, which are formed to have the first, third and fourth data line images adjacent to the trench pattern image 163.

Then, an etching process is performed in the line layer 150 by using the first to fourth data lines 162, 164, 166, 168 as an etching mask to form first to fourth data line patterns 152, 154, 156, 158 on the interlayer insulating layer 130. The first data line pattern 152 is disposed to overlap the line contact hole 135, and the second, third and fourth data line patterns 154, 156, 158, which are formed in order near the first data line pattern 152, form a group of data line patterns 159.

The first data line pattern 152 has a trench groove 153 corresponding to the second data line 162 having the trench pattern 163. The photoresist layer 160 is removed from the semiconductor substrate 120, so that the first to fourth data line patterns 154, 152, 156, 158 only remain on the interlayer insulating layer 130. The first data line pattern 152 is formed on the interlayer insulating layer 130 to fill the line contact hole 135, and is formed to extend from one side of the upper of the hole 135 to a predetermined width K. As such, the first data line pattern 152 is formed to have a predetermined width J, and overlap the line contact hole 135. The first data line pattern 152 is formed to be spaced apart from the group of data line patterns 159 to a predetermined distance L. The second, third, and fourth data line patterns 154, 156, 158 are formed to have a predetermined width M. Further, the distances L between the second and third data line patterns 154, 156, and the third and fourth 156, 158 have the same size as the width M of them. The second, third and fourth data line patterns 154, 156, 158 may be formed of a line and/or a metal line.

Figure 9:
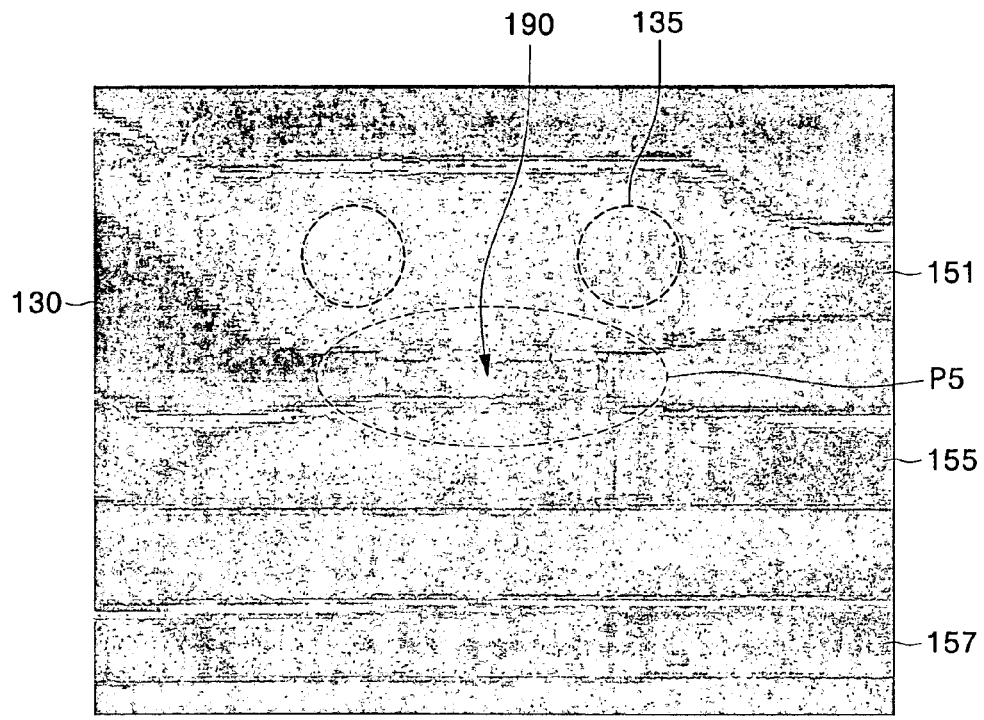
FIGS. 9 and 10 are photographs showing data line patterns on a semiconductor substrate.
Figure 10:
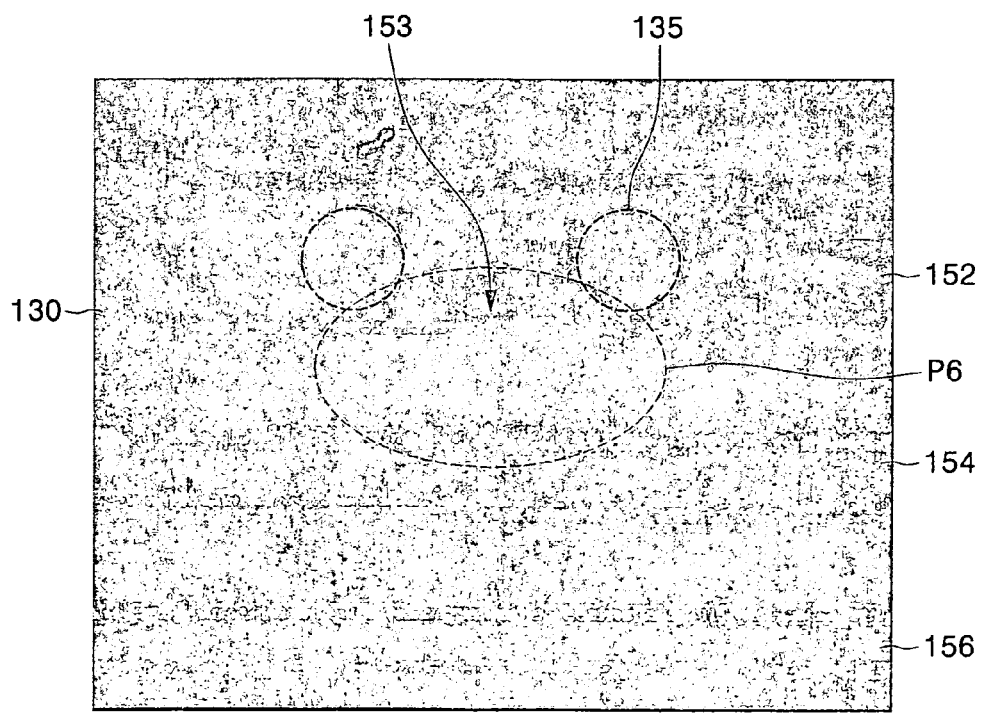

Referring to FIGS. 1, and 9 through 10, first data line patterns 151, 152, second data line patterns 154, 155, and third data line patterns 156, 157 are formed on the semiconductor substrate having interlayer insulating layer 130. The data line patterns 151, 152, 154, 155, 156, 157 can be formed on the interlayer insulating layer 130 through the semiconductor fabrication processes, including the photo process and the etching process described in FIGS. 6 and 9. The interlayer insulating layer 130 can be formed to have at least two line contact holes 135. FIG. 9 illustrates the first to third data line patterns 151, 155, 157 corresponding to a portion P1 of FIG. 1, which are formed on the interlayer insulating layer 130 by using the first to third line patterns 72, 74, 76 of FIG. 1 without the trench pattern 73 on one side of the first line pattern 72 through the semiconductor fabrication processes. Further, as shown in the dotted circled portion P5 of FIG. 9, the first to third data line patterns 151, 155, 157 are formed to have an electric short 190. The electric short 190 is caused because not of considering the widths B1, D1, F1 of the first to third line patterns 72, 74, 76 on the mask substrate 50. That is, the distances C1, E1 between the first and second line patterns 72, 74, and the second and third line patterns 74, 76, are formed to have the same size, but the width B1 of the first line pattern 72 overlapping the line hole 60 is formed to be the sum of the widths D1, F1 of the second and third line patterns 74, 76, or to be higher than the sum of the widths D1, F1 of them. As such, light interference effect can be found more around the first line pattern 72 than around the second and third line patterns 74, 76, in view of widths and distances. The light interference effect is due to photo light passing the line photo mask 85 during the exposure step of the photo process. The light interference effect starts from the portion A of the first line pattern 72 between the line holes 60. Further, in the case that the first line pattern 72 is formed to be isolated from the first and third line patterns 74, 76, the light interference effect can occur much more around the first line pattern 72 between the line holes 60. The width of the second data line image 162 of FIG. 6, which overlaps the line contact holes 135 on the semiconductor substrate 120, may become greater than expected due to the light interference effect. This causes electric shorts in a dotted circled portion P5 between the first and second data line patterns 151, 155 after an etching process.

On the other hand, in the case of performing the semiconductor fabrication processes on the interlayer insulating layer 130 by using the line photo mask 85, the first to third data line patterns 152, 154, 156 are formed on the interlayer insulating layer as shown in FIG. 10. The first to third data line patterns 152, 154, 156 is not formed to have electric shorts in the dotted circled portion P6 as shown in FIG. 10. The first to third data line patterns 152, 154, 156 are formed by using the first line pattern 74, the first line pattern 72 having the trench pattern 73 and the third line pattern 76 as shown in FIG. 1. There is a reason that electric shorts 190 do not occur in the dotted circled portion P6, which is because the trench pattern 73 is formed in the first line pattern 72 in consideration of the widths B1, D1, F1 of the first to third line patterns 74, 72, 76 on the mask substrate 50. With the line photo mask 85, the electric shorts between the first and second data line patterns 154, 152 on the interlayer insulating layer can be prevented in advance by using the first line pattern 72 having the trench pattern 73 between the line holes 60. Thus, the trench pattern 73 in the first line pattern 72 can increase a freedom of the photo process.

As described above, according to the invention, the line photo mask has the trench pattern in one selected from line patterns on the mask substrate, thereby minimizing the light interference effect around the one during the photo process, and preventing in advance electric shorts between the data line patterns corresponding to the line patterns on the semiconductor substrate. Therefore, the line photo mask having the trench pattern can improve the interconnection characteristics of the line patterns.

Embodiments of the invention will now be illustratively described. Embodiments of the invention provide representative line photo masks and methods of fabricating semiconductor devices using the same.

According to certain embodiments of the invention, there is provided line photo masks that includes a mask substrate. A first line pattern is disposed on a main surface of the mask substrate. And a second line pattern is disposed adjacent to, and preferably in parallel with, the first line pattern on the main surface of the mask substrate. The second line pattern overlaps the line holes. At this juncture, the second line pattern has a trench pattern in one side thereof between the line holes, thereby increasing the distance between the first and second line patterns.

According to some embodiments of the invention, there is provided methods of fabricating semiconductor devices by using line photo masks that includes forming an interlayer insulating layer on a semiconductor substrate. The interlayer insulating layer are formed having a plurality of line contact holes which are typically in line with each other. A line layer and a photoresist layer are sequentially formed on the semiconductor substrate having the line contact holes. A line photo mask having first and second line patterns is formed on the photoresist layer. The second line pattern has a trench pattern. A photo process is performed in the photoresist layer using the line photo mask to form photoresist patterns. An etching process is performed in the line layer using the photoresist patterns as an etching mask to form first and second data line patterns on the interlayer insulating layer. The photoresist layer is then removed from the semiconductor substrate. At this time, the photoresist patterns are first and second data line images corresponding to the respective first and second line patterns of the line photo mask on the interlayer insulating layer. And the second data line image is formed to overlap the line contact holes and have a trench pattern image disposed between the line contact holes.

Having described and illustrated the principles of the invention in a preferred embodiment thereof, it should be apparent that the invention can be modified in arrangement and detail without departing from such principles. We claim all modifications and variation coming within the spirit and scope of the following claims.

What is claimed is:

1. A line photo mask which is alignable with a contact hole photo mask having a plurality of line holes during fabrication of semiconductor devices, the line photo mask comprising:
   a mask substrate;
   a first line pattern disposed on a main surface of the mask substrate; and
   a second line pattern disposed in parallel with the first line pattern on the main surface of the mask substrate, the second line pattern being overlapped with the line holes, wherein the second line pattern has a trench pattern in one side thereof between the line holes, the first and second line patterns being separated at a distance which prevents electric shorts between data line images.

2. The line photo mask according to claim 1, wherein the second line pattern has a width that is greater than the width of the first line pattern.

3. The line photo mask according to claim 1, further comprising third and fourth line patterns located substantially parallel to the first line pattern and disposed opposite to the second line pattern.

4. The line photo mask according to claim 3, wherein each of the third and fourth line patterns has substantially the same width as the width of the second line pattern, the distance between the third and fourth line patterns being substantially the same as the distance between the first and second line patterns.

5. The line photo mask according to claim 1, wherein a distance between a bottom surface of the trench pattern and one side of the second line pattern facing the bottom surface is smaller than a width of the second line pattern.

6. The line photo mask according to claim 1, wherein the line photo mask is a binary mask.

7. The line photo mask according to claim 1, wherein the trench pattern is disposed on the mask substrate on one side of the second line pattern extending toward the interior of the second line pattern, a bottom surface of the trench pattern being substantially perpendicular to a side surface of the trench pattern.

8. The line photo mask according to claim 7, wherein a width of an upper opening of the trench pattern is substantially the same size as that of the bottom surface thereof, and smaller than a distance between the line holes.

9. The line photo mask according to claim 7, wherein the trench pattern has a depth which is not greater than a distance between a side of the second line pattern and a side of the line hole adjacent to the side of the second line pattern.

10. The line photo mask according to claim 7, wherein a distance between a side of the second line pattern and a side of the line hole adjacent the side of the second line pattern is greater than that between an extension line of the line hole disposed with the shortest length from a selected corner of the trench pattern and a lateral surface of the trench pattern in a direction perpendicular to a width of the second line pattern.

11. The line photo mask according to claim 1, wherein the trench pattern is disposed to extend from a side of the second line pattern toward the interior of the second line pattern such that a bottom surface of the trench pattern forms an obtuse angle with respect to side surfaces thereof.

12. The line photo mask according to claim 10, wherein a width of the trench pattern becomes smaller extending toward the interior of the second line pattern, and a width of a bottom surface of the trench pattern is smaller than a distance between the line holes.

13. The line photo mask according to claim 10, wherein the trench pattern has a depth which is less than ½ the width of the second line pattern.

14. A method of fabricating semiconductor devices comprising:
   forming an interlayer insulating layer on a semiconductor substrate, the interlayer insulating layer having a plurality of line contact holes disposed in line;
   sequentially forming a line layer and a photoresist layer on the interlayer insulating layer of the semiconductor substrate;
   forming a line photo mask having first and second line patterns on the photoresist layer, the second line pattern having a trench pattern;

performing a photo process in the photoresist layer using the line photo mask to form a photoresist pattern;

performing an etching process in the line layer using the photoresist pattern as etch masks to form first and second data line patterns on the interlayer insulating layer; and removing the photoresist layer from the semiconductor substrate, wherein the photoresist patterns comprise first and second data line images corresponding to the first and second line patterns of the line photo mask on the interlayer insulating layer, and the second data line image is formed so as to overlap the line contact holes and includes a trench pattern image disposed between the line contact holes.

15. The method according to claim 14, wherein the trench pattern image extends from a side of the second data line image toward the interior thereof.

16. The method according to claim 14, wherein the line layer is formed of a conductive layer and a line capping layer.

17. The method according to claim 14, wherein the first and second data line patterns are formed of bit lines or metal lines.

18. The method according to claim 14, wherein the line photo mask is formed of a binary mask.

19. The method according to claim 14, wherein the etching process forms a trench groove in the first data line pattern through the trench pattern image.

20. The method according to claim 14, further comprising:

forming third and fourth line patterns parallel to the first line pattern and disposed opposite to the second line pattern.

21. The method of claim 20, wherein each of the third and fourth line patterns has substantially the same width of the first line pattern, and a distance between the third and fourth line patterns is formed to have the same size as that between the first and second line patterns.

* * * * *

UNITED STATES PATENT AND TRADEMARK OFFICE
CERTIFICATE OF CORRECTION

PATENT NO. : 7,425,389 B2  Page 1 of 1
APPLICATION NO. : 11/024343
DATED : September 16, 2008
INVENTOR(S) : Si-Youn Kim It is certified that error appears in the above-identified patent and that said Letters Patent is hereby corrected as shown below:

Title Page Other Publications, Item [56] English language abstract of the Japanese Publication No. 2003-36111, May 9, 2003., the word "Japanese" should read -- Korean --.

Signed and Sealed this

Thirtieth Day of December, 2008

JON W. DUDAS
*Director of the United States Patent and Trademark Office*